United States Patent [19]
Fuji

[11] Patent Number: 5,719,820
[45] Date of Patent: Feb. 17, 1998

[54] SEMICONDUCTOR MEMORY DEVICE

[75] Inventor: Yukio Fuji, Kanagawa, Japan

[73] Assignee: NEC Corporation, Tokyo, Japan

[21] Appl. No.: 635,652

[22] Filed: Apr. 22, 1996

[30] Foreign Application Priority Data

Apr. 21, 1995 [JP] Japan .................... 7-096462

[51] Int. Cl.$^6$ .................................. G11C 8/00
[52] U.S. Cl. .................... 365/233.5; 365/194
[58] Field of Search ................... 365/233.5, 194

[56] References Cited

U.S. PATENT DOCUMENTS 5,515,323   5/1996   Yamazaki et al. ............ 365/233.5

FOREIGN PATENT DOCUMENTS

1-112589   5/1989   Japan .

Primary Examiner—David C. Nelms
Assistant Examiner—Hoai V. Ho
Attorney, Agent, or Firm—Foley & Lardner

[57] ABSTRACT

Variation of an address signal is detected by an address transition detecting circuit. The trailing edge of a detection pulse ATD is delayed by a delay control circuit to generate a control signal Φ with an expanded pulse width. Selection of word lines of a memory array is controlled depending upon a row address signal by a row decoder. The selected word line is activated only during the pulse period of the control signal Φ. Before making the output of the row decoder into non-active state, the output of a sense amplifier is latched by a latch circuit by the control signal Φ to output to an output circuit. Thus, double selection of the memory cell in transition of the drive signal of the word lines to be selected will never occur, thus avoiding the necessity of measuring for double selection, and the memory access period is shortened.

12 Claims, 10 Drawing Sheets

SEMICONDUCTOR MEMORY DEVICE

BACKGROUND OF THE INVENTION

1. Field of the Invention

The present invention relates generally to a semiconductor memory device. More specifically, the invention relates to an improvement of a row decoder in a read-only semiconductor memory device.

2. Description of the Related Art

Conventionally, this kind of semiconductor memory device has been employed for read-only function as a low priced memory having a large capacity and multi-bit output. For example, FIG. 9 is a circuit diagram showing an equivalent circuit of a memory cell array portion of a read-only semiconductor memory device.

Figure 9:
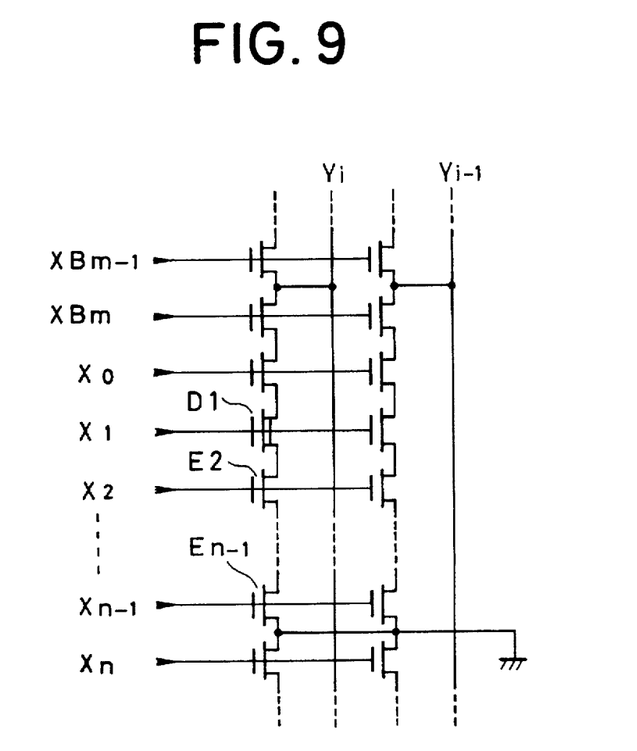
FIG. 9 is a circuit diagram showing an equivalent circuit of a memory cell array portion of the conventional read-only semiconductor memory device.

Referring to FIG. 9, the memory cell array portion of the read-only semiconductor memory device employs a NAND structure formed by connecting n memory cells of field effect transistors in series. One programming system is to write in "0" data for depression transistors and "1" data for enhancement transistors, by ion implantation. The reading operation is discussed with respect to this method.

The gate voltage of the memory cell to be selected is set to "L" level with one output of outputs XO to Xn of the row decoder being a word line selection circuit. On the other hand, the gate voltage of the non-selected memory cell is set to "H" level with the output of the row decoder. When the transistor of the selected memory cell is the enhancement transistor En, since the gate voltage is "L" level, the transistor En goes to the OFF state. Therefore, no current will flow through the NAND type cell series formed by vertically connecting n memory cells.

On the other hand, when the transistor of the memory cell to be selected is the depression transistor Di, since the transistor Di is constantly held ON irrespective of the gate voltage, a current flows through a bit line Yi via the NAND type cell series. Thus, by detecting the current condition, the written data can be read out.

However, through progressive down-sizing of the memory cell due to demand for larger capacity, the gate oxide layer is becoming thinner and thinner. Therefore, at the stand-by state and at the normal read-out state, the non-selected word lines have to be maintained at "H" level resulting in break down of the gate oxide layer and making reading out of the data in the memory cell impossible, or increase the of leak current in the stand-by state.

On the other hand, Japanese Unexamined Patent Publication (Kokai) No. Heisei 1-112589 discloses a method, in which the word line is forcedly placed in a non-selected state corresponding to an external clock in synchronism with the input of address signal for providing margin for double selection. However, in this method, since the selected word line signal is forcedly switched into the non-selected state by the external clock, if the method is applied to reading out from the read-only semiconductor memory device, the load capacity of the memory cell parasiting on the word line is temporarily charged at high speed may cause malfunction upon the occurrence of power source noise.

On the other hand, since the selected word line signal is risen from the power source voltage level, the selection speed becomes lower at higher voltage. Therefore, it is not possible to certainly provide the margin of operation at higher voltage. Furthermore, in the read-only semiconductor memory device which requires large capacity, multi-bit output and low price, the necessity of addition of new address input and necessity of new multi-pin package are disadvantageous for requiring higher cost and a greater mounting area.

SUMMARY OF THE INVENTION

According to one aspect of the invention, a semiconductor memory device having a memory array, in which a plurality of memory cells are arranged in the form of an array, a sense amplifier for sensing memory data of a memory cell designated by a row and column address signals, an output circuit outputting the memory data to an output terminal and an address transition detecting circuit for detecting variation of the row and column address signals for generating a pulse signal, the semiconductor memory device may comprise:

a delay control circuit for providing a delay for a trailing edge of an output pulse signal of the address transition detecting circuit and for outputting a control signal with an expanded pulse width;

a row decoder for selecting a word line of the memory array and for activating the selected word line only in a pulse width period of the control signal, in response to the row address signal; and a latch circuit for inputting and holding the output of the sense amplifier and for outputting the same to the output circuit by the control signal before making the output of the row decoder into non-active state.

In the preferred construction, the memory cell array is divided into a plurality of blocks, the row decoder includes a block selection pre-decoder circuit for decoding a part of an address signal group of the row address signals for generating a block selection pre-decoded signal for selecting one of the block, a word selection pre-decoder circuit for decoding the remaining part of an address signal group of the row address and for generating a word selection pre-decoded signal for selecting a word of the memory cell, a plurality of decoding block circuits provided corresponding to respective of the blocks, selecting one of the word lines of the memory array depending upon the block selection pre-decoded signal, the control signal and the word selection pre-decoded signal and for activating the selected word line only during the period of the pulse width of the control signal. More preferably, each of the decoding block circuits includes AND means for inputting a logical combination signal of the block selection pre-decoded signal and the control signal for generating a word selection control signal and its inverted signal, and a plurality of decoding means for selecting one of the word lines in the memory array according to the word selection pre-decoded signal and activating the selected word line only while the pulse width of the control signal. In a further preferred construction, the AND means comprises a transistor of a first conductive type provided between an output line of the word selection control signal and a first reference potential point and for inputting the control signal on the gate thereof, and a transistor of the first second-conductive type and a plurality of transistors of a second-conductive type provided in series between the output line of the word selection control signal and a second reference potential, wherein the control signal is supplied to the gate of the first transistor and the block selection pre-decoded signal is supplied to respective gates of the plurality of transistors.

The semiconductor memory device may further include an inverter for inverting the word selection control signal.

In the alternative, the decoder means may include transistor of a first conductive type provided between the output line of the word selection pre-decoded signal and the word line of the memory array and being supplied the word selection control signal on the gate thereof, a transistor of a second conductive type provided between the output line of the word selection pre-decoded signal and the word line of the memory array and being supplied the inverted signal on the gate thereof, and a second conductive-type transistor provided between the word line and a second reference potential point and receiving the word selection control signal on the gate.

More preferably, the AND means comprises a transistor of a first conductive type provided between an output line of the word selection control signal and a first reference potential point receiving the control signal on the gate thereof, and a transistor of the first conductive type provided between an output line of the word selection control signal and a first reference potential point and receiving the block selection control signal on the gate thereof, and a transistor of the first conductive type and a plurality of transistors of a second conductive type provided in series between the output line of the word selection control signal and a second reference potential, the control signal being supplied to the gate of the first transistor and the block selection pre-decoded signal being supplied to respective gates of the plurality of transistors.

In a further alternative, the memory cell array is divided into a plurality of blocks, the row decoder includes a block selection pre-decoder circuit for decoding a part of an address signal group and the control signal for generating a block selection pre-decoded signal for selecting one of the block, a word selection pre-decoder circuit for decoding the remaining part of an address signal group of the row address and for generating a word selection pre-decoded signal for selecting a word of the memory cell, a plurality of decoding block circuits, provided corresponding to respective of the blocks, for selecting one of the word lines of the memory array depending upon the block selection pre-decoded signal, the control signal and the word selection pre-decoded signal and for activating the selected word line only during the period of the pulse width of the control signal. Preferably, each of the decoding block circuits includes AND means for inputting a logical combination signal of the block selection pre-decoded signal for generating a word selection control signal and its inverted signal, and a plurality of decoding means for selecting one of the word lines in the memory array according to the word selection pre-decoded signal and for activating the selected word line only during the pulse width of the control signal.

More preferably, the AND means comprises a plurality of transistors of a first conductive type provided between the first reference potential point and the output line of the word selection control signal in parallel and receiving the block selection pre-decoded signal on respective gates thereof, and a plurality of transistors of a second-conductive type provided in series between a second reference potential point and the output line of the word selection control signal and receiving the block selection pre-decoded signal on respective gates.

BRIEF DESCRIPTION OF THE DRAWINGS

The present invention will be understood more fully from the detailed description given herebelow and from the accompanying drawings of the preferred embodiments of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment with reference to the accompanying drawings. In the following description, numerous specific details are set forth in order to provide a thorough understanding of the present invention. It will be obvious, however, to those skilled in the art that the present invention may be practiced without these specific details. In some instances, well-known structures are not shown in detail in order to avoid obscuring the present invention.

Before entering into discussion of the preferred embodiment of a semiconductor memory device according to the present invention, a brief discussion will be given regarding the fundamental construction of a semiconductor memory device, to which the present invention is directed.

Basically, the present invention is directed to a read-only semiconductor memory device employing a row decoder, in which NAND type cells including the memory cell to be selected are divided into a plurality of blocks, all of the non-selecting word selection signals including the memory cells to be selected are set at "H" level, and the word selections signal for all other cell blocks are set at "L" level. Such construction of a read-only semiconductor memory device has been disclosed in commonly owned Japanese Unexamined Patent Publication (Kokai) No. Heisei 7-320494. The disclosure of the above-identified commonly owned Japanese Unexamined Patent Publication No. Heisei 7-320494 is incorporated herein by reference.

Figure 10:
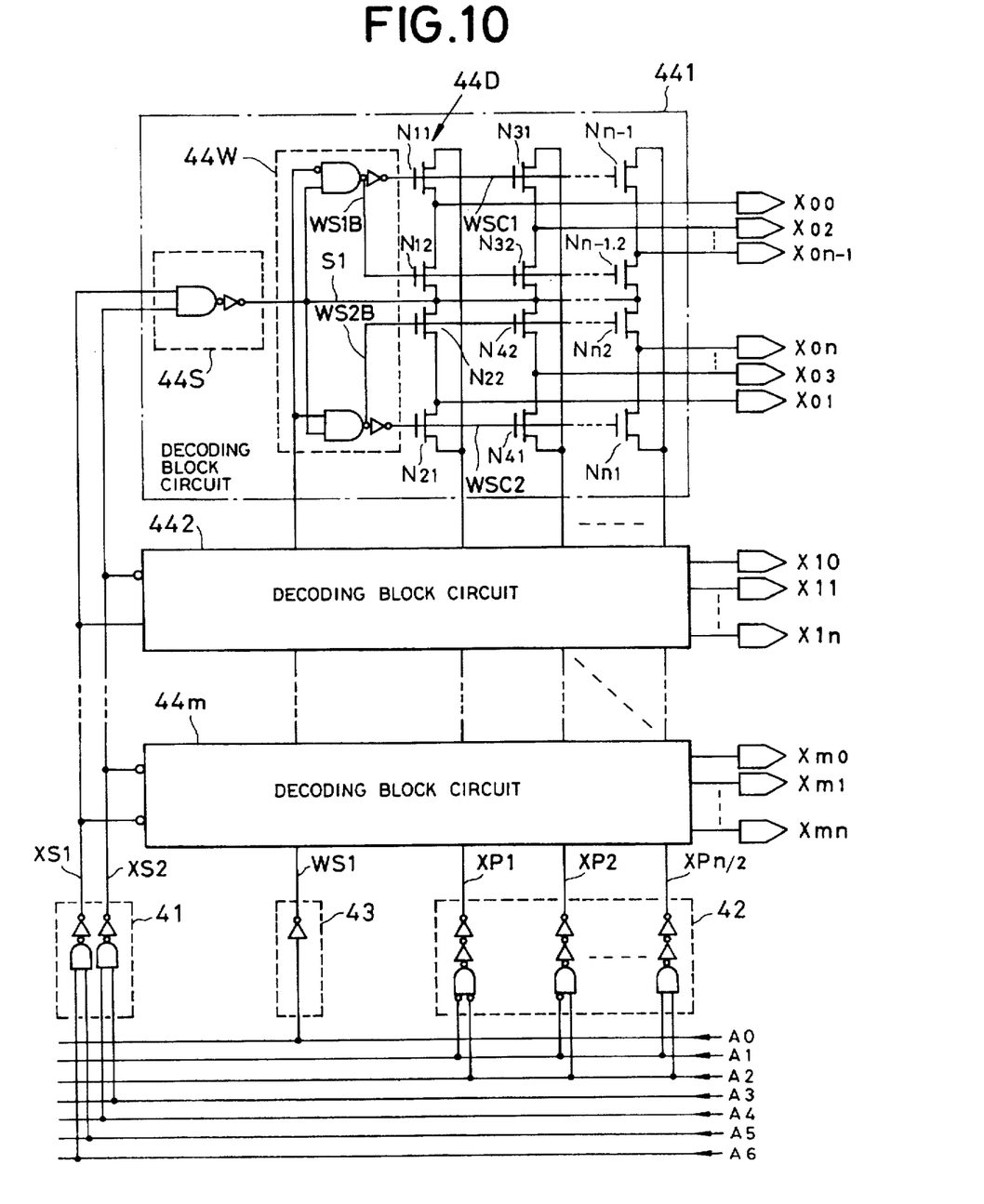
FIG. 10 is a circuit diagram showing one example of the row decoder of a semiconductor memory device, showing a fundamental construction to which the present invention is directed.

FIG. 10 is a circuit diagram showing a whole row decoder of the read-only semiconductor memory device disclosed in the above-identified Japanese Unexamined Patent Publication No. Heisei 7-320494.

Referring to FIG. 10, the row decoder of the read-only semiconductor memory device has a block selection pre-decoder circuit 41, a word selection pre-decoder circuit 42, a word selection circuit 43 and a plurality of decoding block circuits 441 to 44m arranged corresponding to a number of memory cell blocks.

The block selection pre-decoder circuit 41 decodes address signals A3 and A4 and to generate a block selection pre-decoded signal XS2, and decodes address signals A5 and A6 to generate a block selection pre-decoded signal XS1. The word selection pre-decoder circuit 42 decodes address signals A1 and A2 and generates word selection pre-decoded signals XP1 to XPn/2. The word selection circuit 43 inputs an address signal A0 and generates a word selection signal WS1.

In the decode block circuit 441, a selecting portion 44S is formed with a 2-input NAND and an inverter for outputting a block selection signal S1. A word selecting portion 44W is formed with a 2-input NAND, to which the block selection signal S1 and the word selection signal WS1 or its inverted signal are input, and an inverter. The word selecting portion 44W generates a first word selection control signal WSC1 and its inverted signal WS1B and a second word selection signal WSC2 and its inverted signal WS2B. A decoding portion 44D is constituted of N-type transistors N11, N12, N21 and N22 which are controlled by the output of the word selecting portion 44W. A plurality of decoding portions 44D are arranged corresponding to the number of word line signals X00 to X0n required in one memory cell, and are adapted to generate row decoding output.

The operation of the read-only semiconductor memory device shown in FIG. 10 will be discussed with reference to FIG. 11 which is a timing chart showing one example of the operation thereof.

Figure 11:
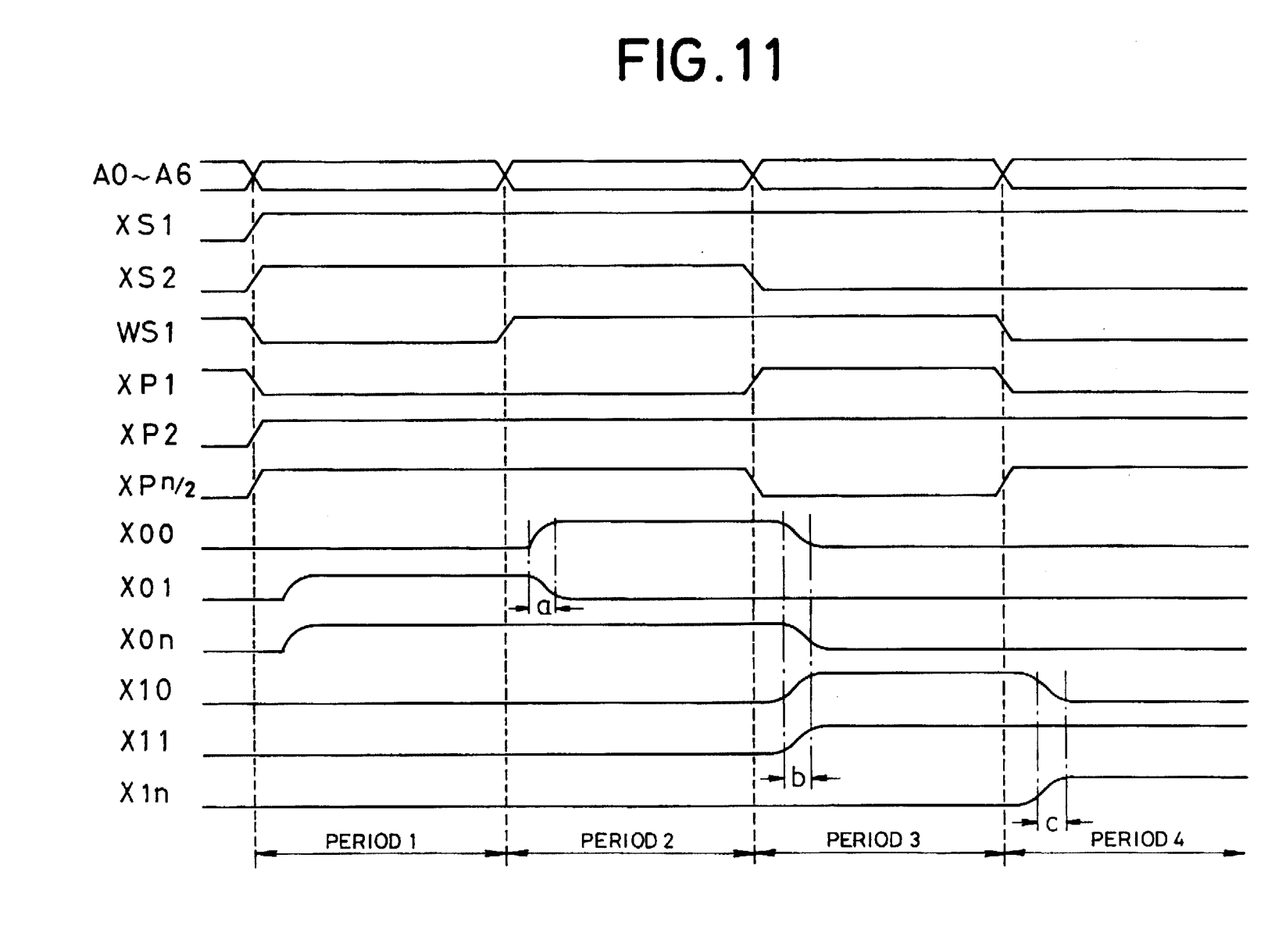
FIG. 11 is a timing chart showing one example of operation of the read-only semiconductor memory device of FIG. 10.

In a period 1 shown in FIG. 11, the block selection pre-decoded signals XS1 and XS2 are set at "H" level respectively by the address signals A3, A4, A5 and A6. In response to inputting of the block selection pre-decoded signal XS1 and XS2, the block selection signal S1 turns into "H" level to place only decoding block circuit 441 in the selected state.

By other address signals A1 and A2, only the XP1 signal is activated among outputs of the word selection pre-decoder circuit 42 to be "L" level, and all of the remaining word selection pre-decoded signals XP2 to XPn/2 become "H" level. On the other hand, by the address signal A0, the word selection signal WS1 is held at "L" level, and thus the first word selection control signal WSC1 and its inverted signal WS1B become "H" level and "L" level, respectively. At the same time, the second word selection control signal WSC2 and its inverted signal WS2B become "L" level and "H" level, respectively.

The transistor N11 which inputs the word selection pre-decoded signal XP1 to the source becomes ON state since the gate voltage is controlled by the first word selection control signal WSC1. On the other hand, the transistor N12 inputting the block selection signal S1 to the source, becomes OFF state since the gate voltage is controlled by the signal WS1B. Accordingly, the word line signal X00 is supplied the potential from XP1 via the transistor N11 and thus becomes the selection state, i.e. "L" level.

The transistor N21 for inputting the word selection pre-decoded signal XP1 to the source has its gate voltage controlled by the second word selection control signal WSC2 and thus becomes OFF state. On the other hand, the transistor N22 inputting the block selection signal S1 to the source, becomes ON state as the gate electrode thereof is controlled by the inverted signal WS2B. Accordingly, the potential of the word line signal X01 is controlled by the block selection signal S1 via the transistor N22 to be the non-selected state, i.e. "H" level.

Similarly, all of the other word line signals X02 to X0n become the non-selected state, i.e. "H" level, and only the memory cell corresponding to the word line signal X00 becomes the selected state.

Next, in a period 2, the word selection signal WS1 becomes "H" level by the address signal A0. At the same time, the first word selection control signal WSC1 and its inverted signal WS1B become "L" level and "H" level, respectively, and the second word selection control signal WSC2 and its inverted signal WS2B become "H" level and "L" level respectively.

The transistor N11 which inputs the word selection pre-decoded signal XP1 to the source becomes OFF state since the gate voltage is controlled by the first word selection control signal WSC1. On the other hand, the transistor N12 inputting the block selection signal S1 to the source, becomes ON state as the gate voltage is supplied by the inverted signal WS1B. Accordingly, the word line signal X00 is supplied the potential from the block selection signal S1 via the transistor N11 and thus becomes the non-selected state, i.e. "H" level.

The transistor N21 inputting the word selection pre-decoded signal XP1 to the source is has its gate voltage controlled by the second word selection control signal WSC2 and thus becomes ON state. On the other hand, the transistor N22 inputting the block selection signal S1 to the source, becomes OFF state as the gate electrode thereof is controlled by the inverted signal WS2B. Accordingly, the potential of the word line signal X01 is controlled by the word selection pre-decoded signal XP1 via the transistor N21 to be the selected state, i.e. "L" level.

Similarly, all of the other word line signals X02 to X0n become non-selected state, i.e. "H" level, and only the memory cell corresponding to the word line signal X01 becomes the selected state.

At this time, while all of the outputs of other decoding block circuits 442 to 44m are held at "L" level, they are placed in the non-selected state since the transistors connecting the memory cell series and the bit line Yi are held in OFF state.

In the semiconductor memory device as set forth above, switching of the selected word line and the non-selected word line is caused at a, b and c in the periods 2, 3 and 4 in FIG. 11. In the operational periods set forth above, double selection of the memory cell can occur resulting in lowering of the operation speed.

The operation of double selection will be discussed with an assumption that a power source voltage of the semiconductor memory device is 5V as typically used.

Figure 12:
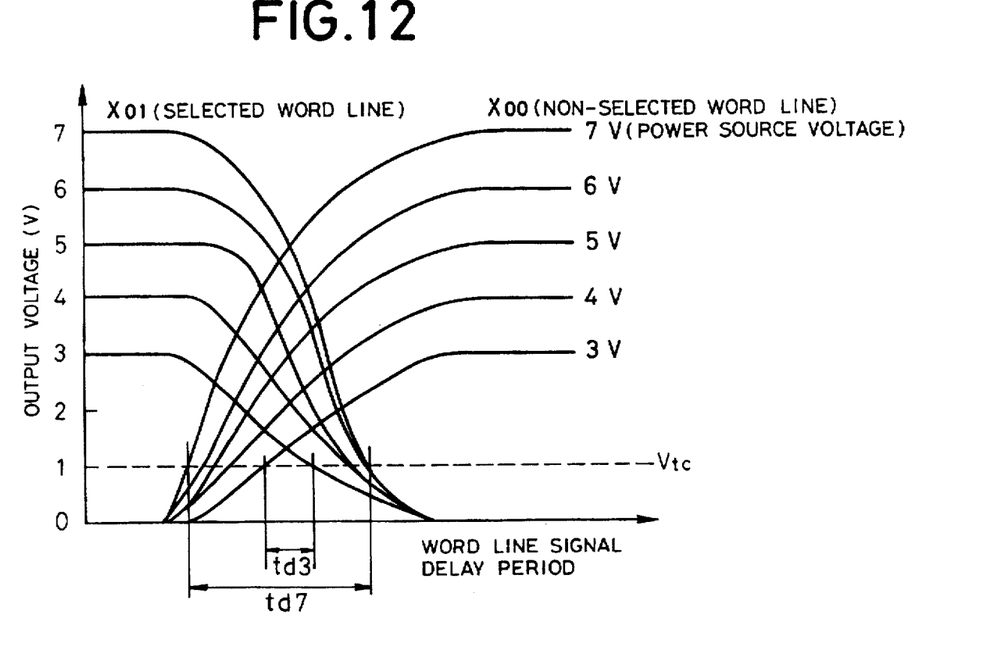
FIG. 12 is a characteristic chart showing a power source voltage dependency of the output waveform in the memory device of FIG. 10.

FIG. 12 is a characteristics chart showing the power source voltage dependency of output waveforms of the non-selected word line and the selected word line in the row decoder set forth above.

Assuming that the threshold value of the memory cell transistor is Vtc, the rising speed of the non-selected word line V00 becomes higher at higher power source voltages. However, the selected word line X01 has to be reduced from the power source voltage level to the threshold value level to lower the speed.

Figure 13:
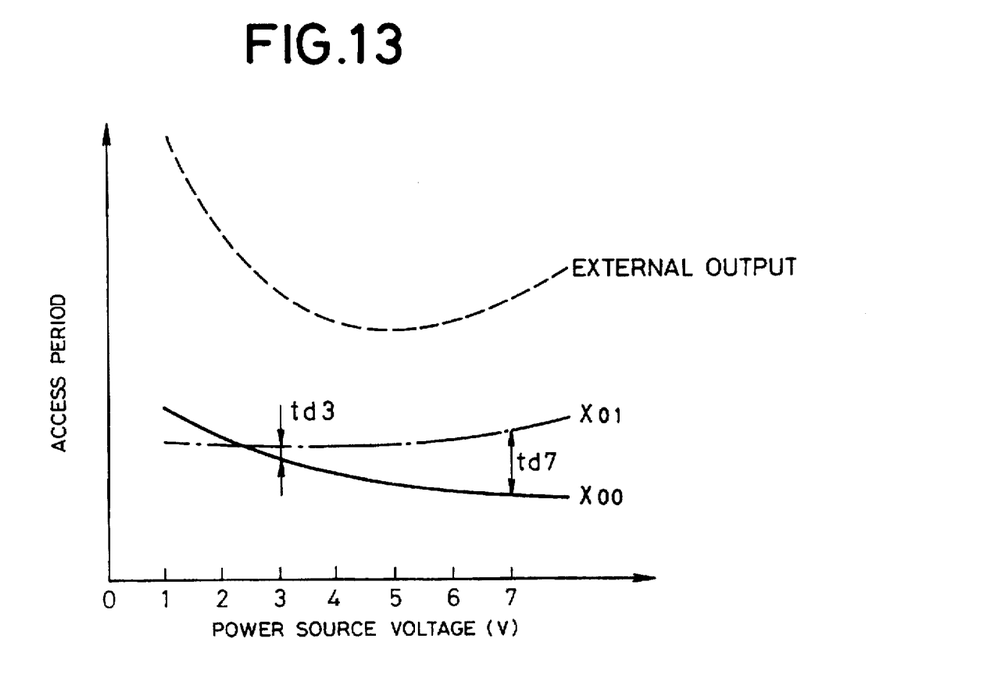
FIG. 13 is a characteristic chart showing a power source voltage dependency of the word line signal and an access period in the memory device of FIG. 10.

On the other hand, FIG. 13 is a characteristics chart showing power source voltage dependency of a timing where the threshold value Vtc of the memory cell transistor and respective word line signals X00 and X01 intersect, namely access timing of the memory cell.

In the shown example, the speed of the word line signals X00 and X01 are equivalent at the power source voltage of 2.5V. When the power source voltage is lower than or equal to 2.5V, speed of the non-selected word line signal X00 is lower than that of the selected word line signal X01 to causing a double selection condition. At this time, when the power source voltage is lower than 5V, the speed of the memory device is determined by the operation speed of the peripheral circuit and the width of the period of double selection and thus the double selection may not affect operation of the memory device.

When the power source is 3V, the speed difference between the word line signals X00 and X01 becomes greater (td3) and when the power source is 7V, the speed difference (td7) between the word line signals X00 and X01 becomes further greater. Namely, this zone (td3 to td7) is the period where a margin for double selection is certainly provided.

On the other hand, when the power source voltage is higher than or equal to 5V, the operation speed of the peripheral circuit becomes higher and the margin for double selection can be certainly maintained, since the speed of the selected word line signal becomes lower to lower the speed of selection of the memory cell to cause lowering of external output speed. Therefore, speed at the high voltage side is reduced to narrow a margin to guarantee operation of the product memory device.

The present invention is intended to make measuring for double selection at rising of the word line signal to be selected unnecessary, and to permit high speed memory access. The preferred embodiments implementing the present invention which accomplish the task set forth above, will be discussed hereinafter.

Figure 1:
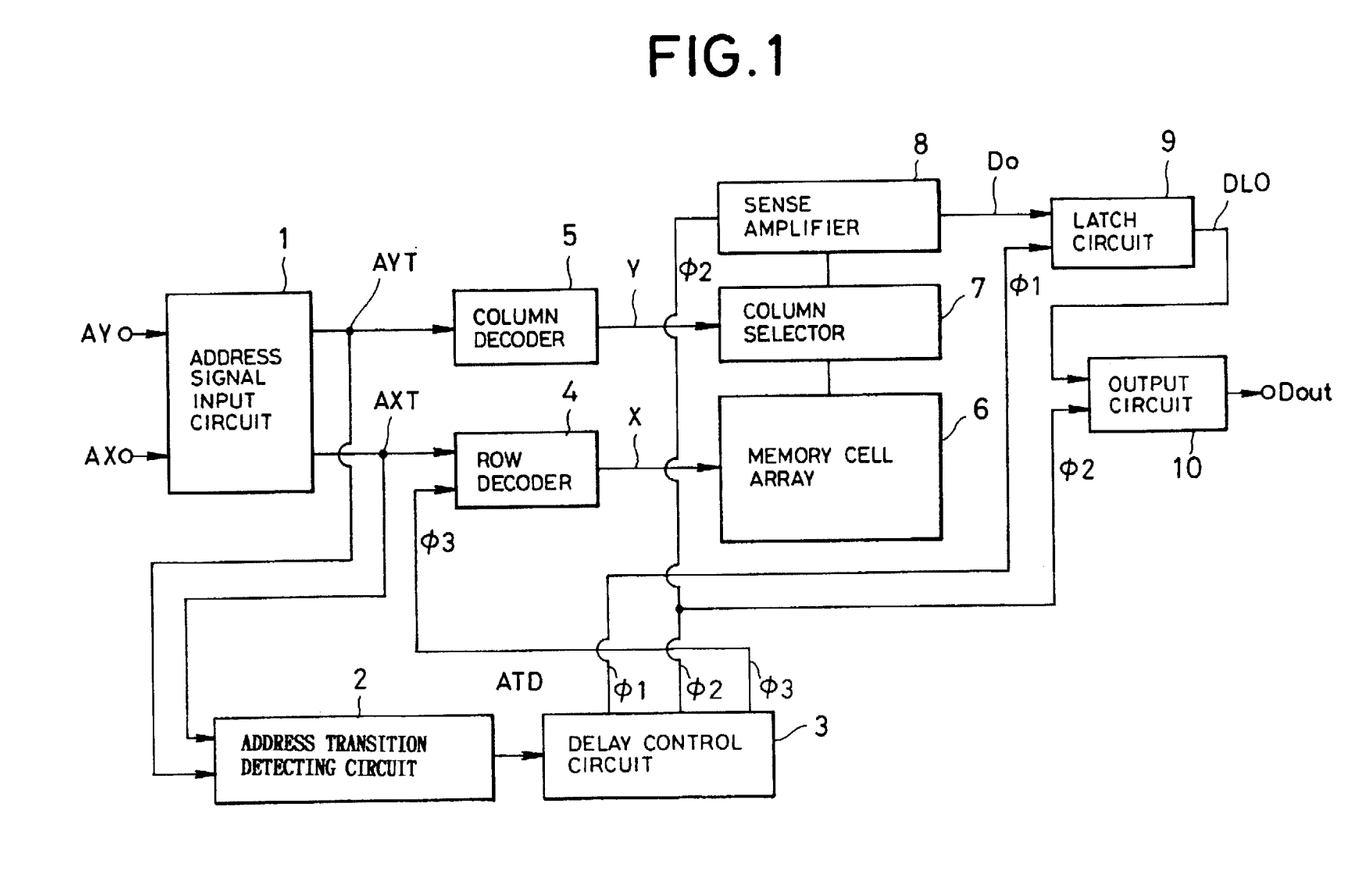
FIG. 1 is a block diagram showing one embodiment of a semiconductor memory device according to the present invention.

FIG. 1 is a block diagram showing one embodiment of the semiconductor memory device according to the invention.

Referring to FIG. 1, the shown embodiment of the semiconductor memory device includes a memory cell array 6, in which a plurality of memory cells are arranged, a sense amplifier 8 for sensing a memory data of the memory cell designated by a row and a column address signals, an output circuit 10 for outputting the memory data to an output terminal, and an address transition detecting circuit 2 for detecting variation of the row and column address signals to generate a pulse signal ATD.

Furthermore, the shown embodiment of the semiconductor memory device further includes a delay control circuit 3 for delaying the trailing end of the output pulse signal ATD of the address transition detecting circuit 2 to expand the pulse width to output control signals $\phi1$, $\phi2$ and $\phi3$, a row decoder 4 selecting the word line of the memory cell array 6 corresponding to a row address signal AXT to activate for driving only in the period of the pulse width of the control signal $\phi3$, and a latch circuit 9 inputting and holding the output of the sense amplifier 8 by the control signal $\phi1$ before deactivating the output of the row decoder and outputting to the output circuit 10.

In addition, as related blocks, address signal input circuit 1, a column decoder 5 and a column selector 7 are illustrated.

Figure 2:
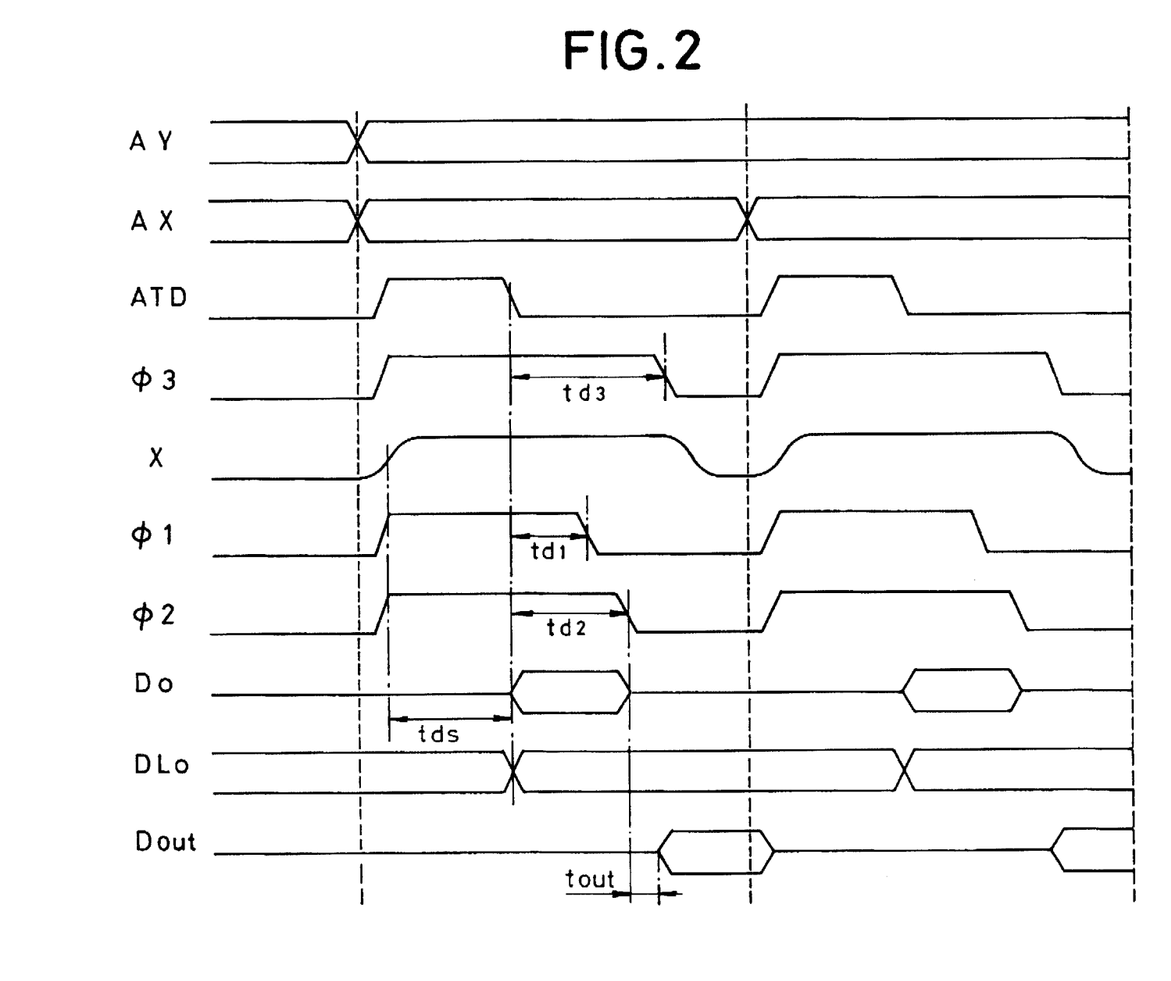
FIG. 2 is a timing chart showing one example of operation in the semiconductor memory device of FIG. 1.

Next, operation of the shown embodiment of the semiconductor memory device will be discussed with reference to FIG. 1 and a timing chart in FIG. 2 which illustrates one example of operation. The shown embodiment of the semiconductor memory device outputs an internal column selection address AYT and an internal row selection address AXT, respectively, in response to external application of a column selection address input signal AY and a row selection address input signal AX. The column address selection signal AYT and the row address selection signal AXT are respectively input to the row decoder 4 and the column detector 5. A column decoder output Y is input to a column selector 7 to place the desired bit line of the memory cell array 6 in selected condition.

On the other hand, these address signals AYT and AXT are simultaneously input to the address transition detecting circuit 2. From the address transition detecting circuit 2, an address transition detection pulse signal ATD is generated. The delay control circuit 3 inputting the pulse signal ATD delays the trailing end of the pulse signal ATD for td1 to expand the pulse width to generate the control signal $\phi1$, for td2 to expand the pulse width to generate the control signal $\phi2$ and for td3 to expand the pulse width to generate the control signal $\phi3$. Here, the relationship of the pulse widths $\phi1$, $\phi2$ and $\phi3$ becomes $\phi1 < \phi2 < \phi3$.

At the rising edge of the control signal $\phi2$, the sense amplifier 8 becomes active state and the output circuit 10 becomes non-active state. At the rising edge of the control signal $\phi1$, the latch circuit 9 becomes active state to enable data latching. The control signal $\phi3$ is input to the row decoder 4, to be active state in combination with the output AXT of the address signal input circuit 1. The word line signal X of the memory cell array 6 becomes selected condition simultaneously with rising of the control signal $\phi3$.

The data of the memory cell selected by the word line signal X is transmitted to the sense amplifier 8 via the column selector 7 which is preliminarily selected, and outputs amplified data D0 with a delay period tds from word line signal X. The amplified data D0 is input to the latch circuit 9 and output DL0 is transmitted to the output circuit 10. Since the output circuit 10 is in the non-active state, external output terminal Dout becomes high resistance condition.

When the control signal $\phi1$ falls after a delay period of td1, the latch circuit 9 shuts off the output D0 of sense amplifier to be in internally hold condition. Next, the control signal $\phi2$ falls, and the sense amplifier 8 becomes non-active state. In conjunction therewith, the output circuit 10 becomes active state. Data DLo held by the latch circuit 9 is output as the output signal Dout. Also, after falling of the control signal $\phi2$, the control signal $\phi3$ falls to make the row decoder 4 in non-active state.

Conventionally, the outputs of the address transition detecting circuit 2 and the display control circuit 3 are used as an equalization signal for speeding up the sense amplifier 8 or as an output circuit control signal as measure for power source/GND noise of the output circuit 10.

However, in the present invention, the row decoder 4 is controlled by the control signal $\phi3$ to make all of the word line signal X as the output of the row decoder 4 non-active state before initiation of the next read operation by variation of the next address signal, for avoiding double selection condition of the word line signal X during the reading out period. In conjunction therewith, by providing the latch circuit 9 which inputs and holds the output of the sense amplifier 8 and output to the output circuit 10, compatibility to the prior art is certainly maintained in the output timing of the output signal Dout.

Figure 3:
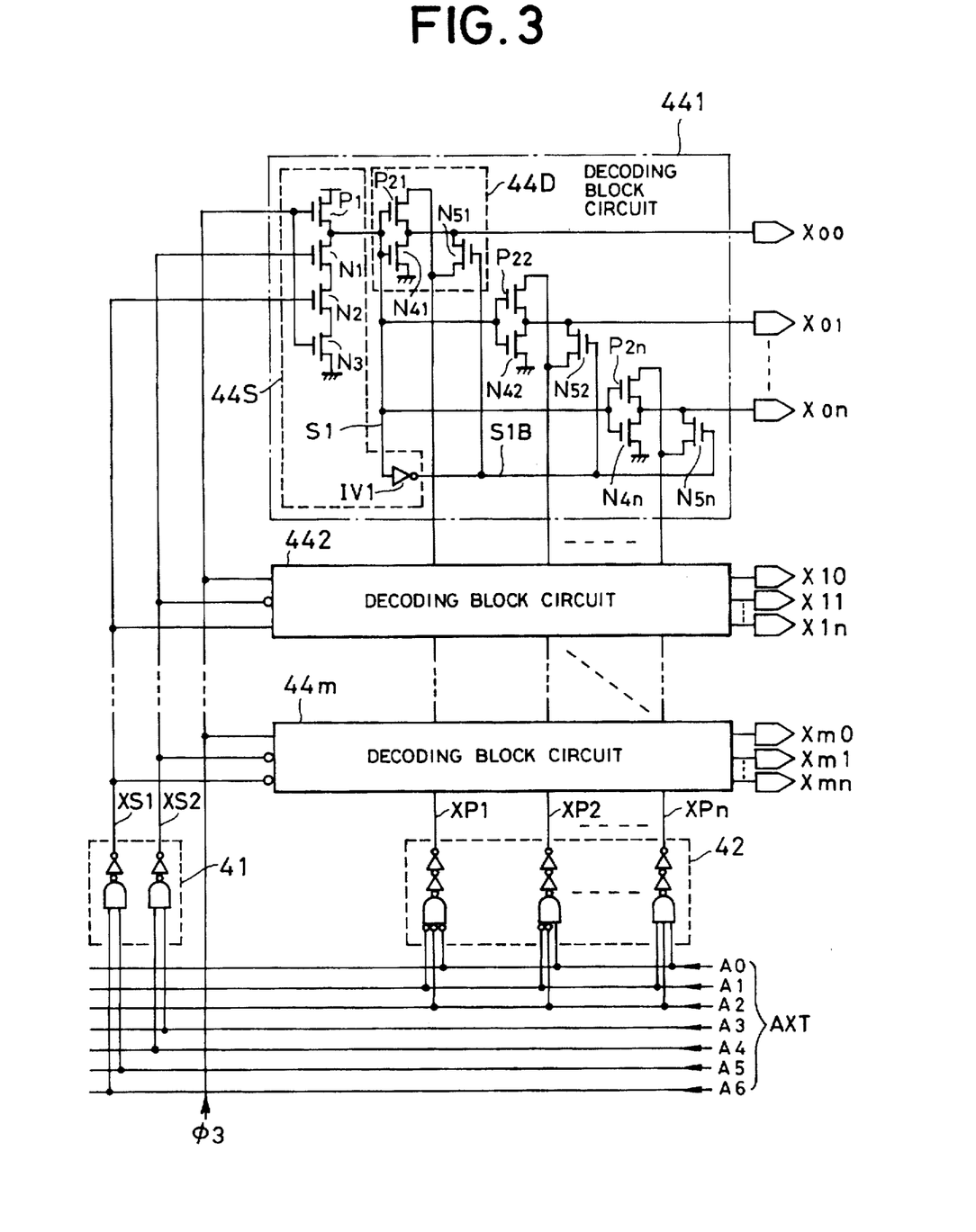
FIG. 3 is a circuit diagram showing one example of construction of a portion of the row decoder in FIG. 1.

FIG. 3 is a circuit diagram showing one embodiment of construction of the row decoder 4 of FIG. 1. It should be noted that the memory cell array 1 of FIG. 1 is divided into a plurality of blocks in like manner to the memory cell array in FIG. 10.

In FIG. 3, the block selection pre-decoder circuit 41 decodes a part of the row address signal group A0 to A6 (upper address group A3 to A6) and outputs block selection pre-decoded signal XS1 and XS2.

The word selection pre-decoder circuit 42 decodes the remaining address group (lower address group A0 to A2) of the row address signal group A0 to A6 and outputs word selection pre-decoded signals XP1 to XPn.

Decoding block circuits 441 to 44m are provided corresponding to respective blocks of the memory cell array. Respective decoding block circuits select the word lines of the memory array corresponding to the word selection pre-decoded signals XP1 to XPn on the basis of AND output of the logical combination signal of the block selection pre-decoded signals XS1 and XS2 and the control signal φ3 and activates the selected word lines only in the period corresponding to the pulse width of the control circuit φ3.

In the decoding block circuits provided in corresponding number to the number of memory cell blocks, the select portion 44S is constituted of an AND means for receiving the logical combination signal of the block selection pre-decoded signals XS1 and XS2 and the control signal φ3, and generates the word selection control signal S1 and its inverted signal S1B. The decoding portion 44D selects the word line of the memory array corresponding to the word selection pre-decoded signals XP1 to XPn on the basis of the word selection control signal S1 and its inverted signal S1B, and activates the selected word line only during the pulse width period of the control signal φ3.

Furthermore, the selecting portion 44S is constructed with a circuit connecting N-type transistors N1 and N2 which inputs the block selection pre-decoded signals XS1 and XS2 on the gates, respectively, in series, between the P-type transistor P1 inputting the control signal φ3 on the gate and a N-type transistor N3, and outputs the word selection control signal S1 from the junction of series connection with the P-type transistor P1, and an inverter IV1 for outputting the inverted signal S1B of the word selection control signal.

On the other hand, the decoding portion 44D is constructed with a circuit connecting P-type transistor P21 for inputting the word selection control signal S1 on the gate and an N-type transistor N51 for inputting the inverted signal S1B on the gate, in parallel between the word selection pre-decoded signals XP1 to XPn and the word lines of the memory cell array, and an N-type transistor N41 for inputting the word selection control signal S1, which is connected between the word line and the earth line.

Next, discussion will be given for operation of the shown embodiment of the word decoder with reference to FIG. 3 and FIG. 4 which is a timing chart illustrating one example of operation of the row decoder.

Figure 4:
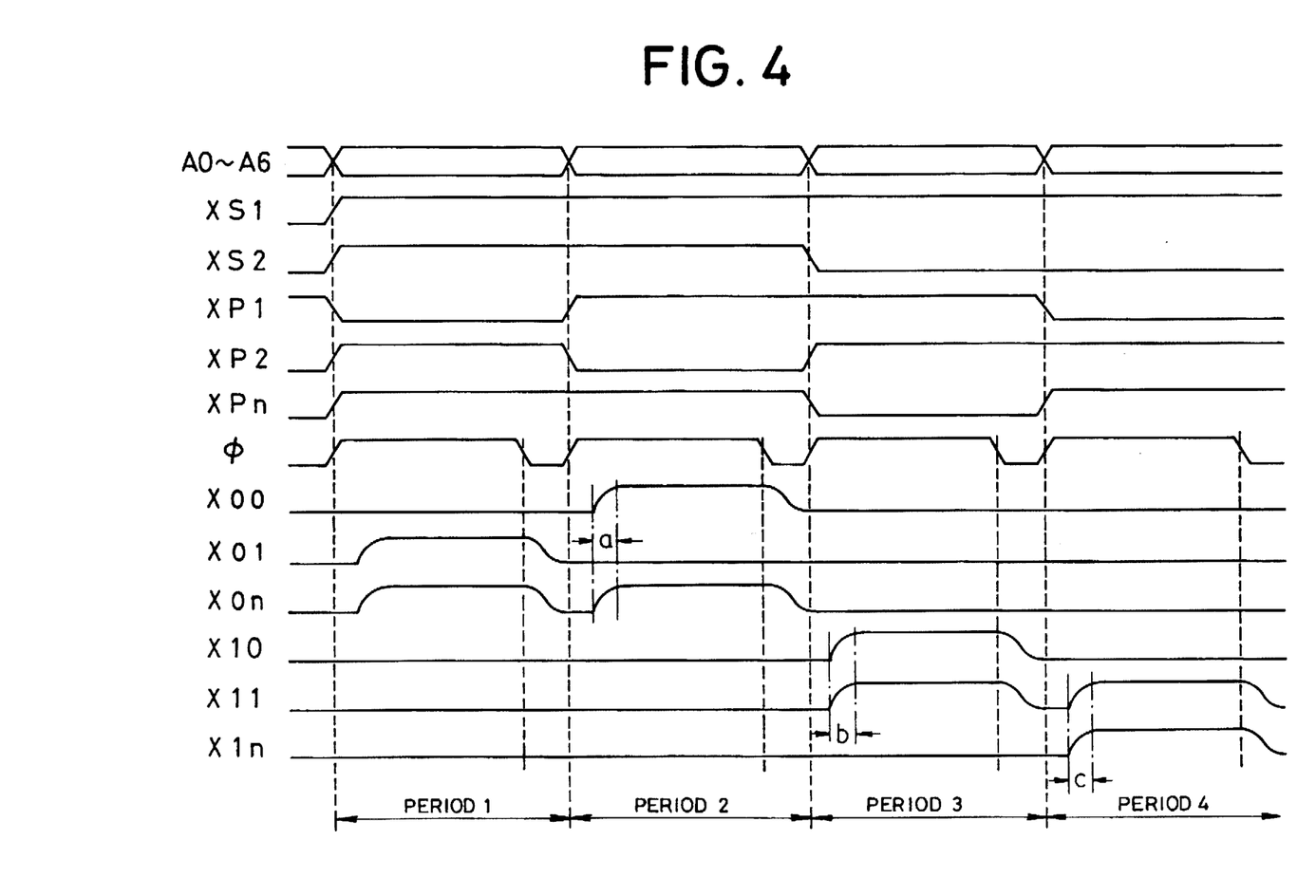
FIG. 4 is a timing chart showing one example of operation of the embodiment of FIG. 3.

In period 1 of FIG. 4, when the block selection pre-decoded signals XS1 and XS2 become "H" level respectively by the address signals A3 to A6, only decoding block circuit 441 which takes the block selection pre-decoded signals XS1 and XS2 as inputs becomes selection enabled state.

On the other hand, by the address signals A0 to A2, only word selection pre-decoded signal XP1 is activated to be "L" level, and remaining word selection pre-decoded signals XP2 to XPn become "H" state. Variation of the address signal input is detected by the address transition detecting circuit 2 to generate the pulse signal ATD. Then, the trailing edge of the pulse signal ATD is delayed for a period td3 by the delay control circuit 3 to supply the control signal φ3 having the pulse width corresponding to the trailing edge delayed ATD.

When the control signal φ3 is varied from "L" level to "H" level, the P-type transistor P1 is turned OFF and the N-type transistors N3, N2 and N1 are turned ON. As a result, the word selection control signal S1 becomes "L" level and the inverted signal S1B inverted through the inverter IV1 becomes "H" level to make the selecting portion 44S active.

Next, in the decoding portion 44D, the P-type transistor P21 and the N-type transistor N41 inputting the word selection control signal S1 become ON state and OFF state, respectively, and the transistor N51 inputting the inverted signal S1B becomes ON state. Accordingly, the word line signal X00 is supplied its potential by the word selection pre-decoded signal XP1 to be in the selected state, i.e. "L" level.

On the other hand, the P-transistors P22 to P2n and the N-type transistors N42 to N3n inputting the word selection control signal S1 become ON state and OFF state. On the other hand, the transistors N52 to N5n inputting the inverted signal S1B are placed into ON state. Accordingly, other word line signals X01 to X0n other than the decoding block circuit 441 are supplied the output level from the word selection pre-decoded signals XP2 to XPn and thus become non-selected state, i.e. "H" level.

When the data is read out from the memory cell and the control signal φ3 is turned from "H" level into "L" level, the P-type transistor P1 is turned ON and the N-type transistor N3 is turned OFF, the word selection control signal S1 becomes "H" level, and consequently, the inverted signal S1B from the inverter IV1 becomes "L" level. Thus, the selecting portion 44S becomes non-active state.

At this time, the P-type transistors P21 to P2n and the N-type transistors N51 to N5n become OFF state and the N-type transistors N41 to N4n become ON state. Thus, all of the word line signal X00 and other word line signals X01 to X0n as the outputs of the decoding portion 44D become "L" level.

Next, in period 2, by the address signals A0 to A2, only word selection pre-decoded signal XP2 becomes active to be "L" level, and all of other word selection pre-decoded signals XP1, XP3 to Xpn become "H" level. Similar to period 1, the word line signals X00 to X0n are supplied the potential thereof from the word selection pre-decoded signals XP1 to XPn. Thus, the word line signal X01 is supplied the "L" level of the corresponding word selection pre-decoded signal XP2 to be the selected state. On the other hand, other word line signals X00, X02 to X0n are respectively supplied "H" level from corresponding word selection pre-decoded signals XP1, XP3 to XPn to be the non-selected state.

The potentials of these word lines are all pulled down to "L" level before the next variation of the address input similar to period 1, in response to change of the control signal φ3 from "H" level to "L" level.

Next, in period 3, when the block selection pre-decoded signals XS1 and XS2 become "H" level and "L" level respectively by the address signals A3 to A6, the word selection control signal S1 is capacitively maintained at "H" level irrespective of the control signal φ3 and thus the inverted signal S1B thereof is fixed at "L" level. Therefore, the P-type transistors P21 to P2n and the N-type transistors N51 to N5n become OFF state, and N-type transistors N41 to N4n become ON state.

Then, all of the word line signals X00 to X0n become "L" level to make the decoding block circuit 441, which is held in selected state become non-active state. In place, the decoding block circuit 442 becomes active. Then, the word line signals X10 to X1n perform operations similar to the above. Therefore, redundant discussion will be avoided.

Comparing the timing chart shown in FIG. 11, in which the operation of the row decoder in the basic construction is illustrated, with the timing chart in FIG. 4 showing one example of operation of the shown embodiment of the row decoder, at a portion a in period 2, a portion b in period 3 and a portion c in period 4, it should be appreciated that, in the shown embodiment, switching between the selected word line signal and the non-selected word line signal is avoided and only the non-selected word line signal is varied from "L" level to "H" level.

Figure 5:
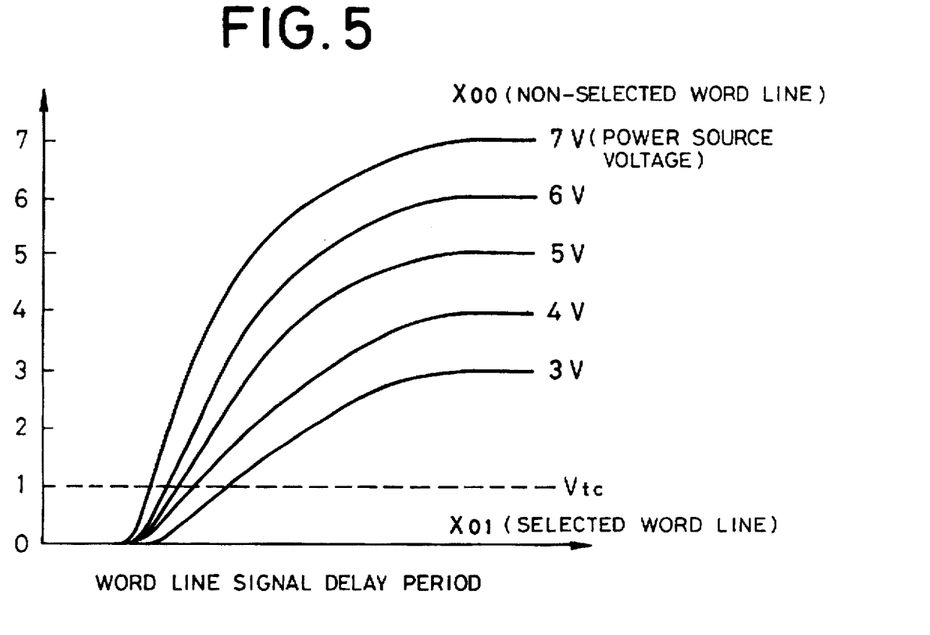
FIG. 5 is a characteristic chart showing the power source dependency of an output waveform in the embodiment of FIG. 3.

FIG. 5 is a characteristic chart showing the power source voltage dependency of the output waveform of the non-selected word line of the shown embodiment of the row decoder. Comparing the characteristic chart of FIG. 5 with the characteristic chart shown in FIG. 12, the selected word line signal X01 is constantly fixed at 0V irrespective of the power source voltage, and the non-selected word line signal X00 is accelerated according to elevating of the power source voltage.

Figure 6:
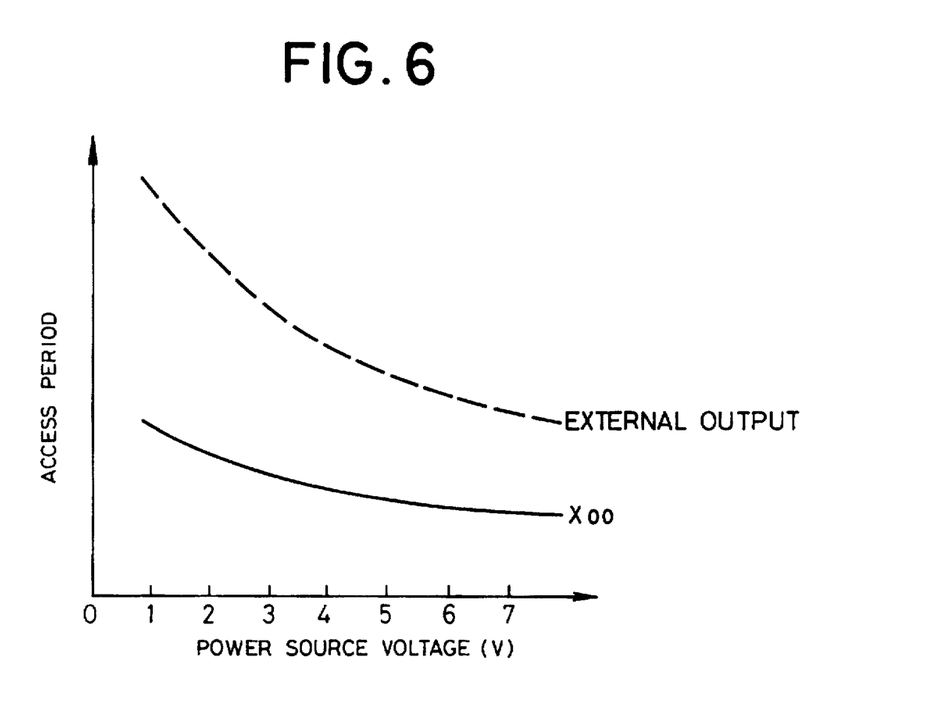
FIG. 6 is a characteristic chart showing power source voltage dependency of a word line signal and an access period in the example of FIG. 3.

On the other hand, FIG. 6 is a characteristic chart showing power source voltage dependency of the cross timing of the word line signal XOO and the threshold value Vtc of the memory cell transistor, and access period of the shown embodiment of the row decoder.

The characteristic chart of FIG. 6 is compared with that of FIG. 13 in which is illustrated the characteristic charge of power source voltage dependency of the cross timing of the word line signal X00 and the threshold value Vtc of the memory cell transistor, and access period, in the basic construction to which the present invention is directed. Since the selected word line signal X01 is already in the selected state of "L" level upon initiation of reading out in response to variation of the external address, and thus the speed is zero in the shown embodiment. Therefore, in the shown embodiment, the power source voltage does not influence reading out speed. The non-selected word line signal X00 is speeded up according to elevating of the power source voltage similarly to FIG. 13.

As set forth above, since the reading out speed depends on the speed of the non-selected word line signal X00, the external output speed is never affected by the elevated voltage.

Figure 7:
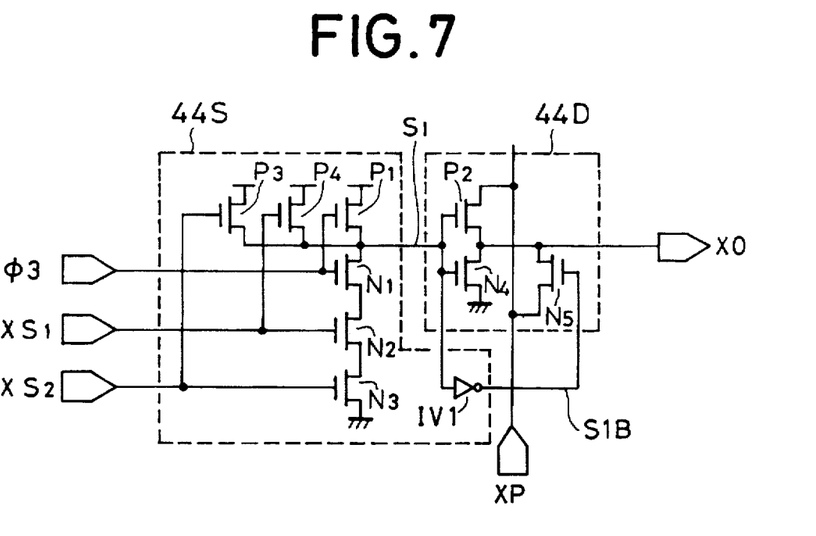
FIG. 7 is a circuit diagram showing another embodiment of the row decoder in FIG. 1.

FIG. 7 is a circuit diagram showing another embodiment of the row decoder in the preferred embodiment of the semiconductor memory device according to the invention. With reference to FIG. 7, the shown embodiment of the row decoder is differentiated from the former embodiment of the row decoder in that the transistor element of the selecting portion 44s is constructed as completely complementary NAND structure, and the decoding portion 44D is constructed to the same as the former embodiment of the row decoder.

In this embodiment, since the selecting portion 44S is constructed as completely complementary NAND structure, while any one of the block selection pre-decoded signal XS1 and XS2 or the control signal φ3 is "L" level, the word selection control signal S1 and its inverted signal S1B are respectively "H" level and "L" level, and the N-type transistors N4 become ON state. Therefore, the word line signal X0 becomes "L" level.

On the other hand, only in the period where all of the block selection pre-decoded signals XS1 and XS2 and the control signal φ3 are "H" level, the word selection control signal S1 and its inverted signal S1B become "L" level and "H" level respectively, and P-type transistor P2 and the N-type transistors N5 become ON state. Therefore, the potential level of the word selection pre-decoded signal XP is supplied to the word line signal X0 in synchronism with the control signal φ3.

Figure 8:
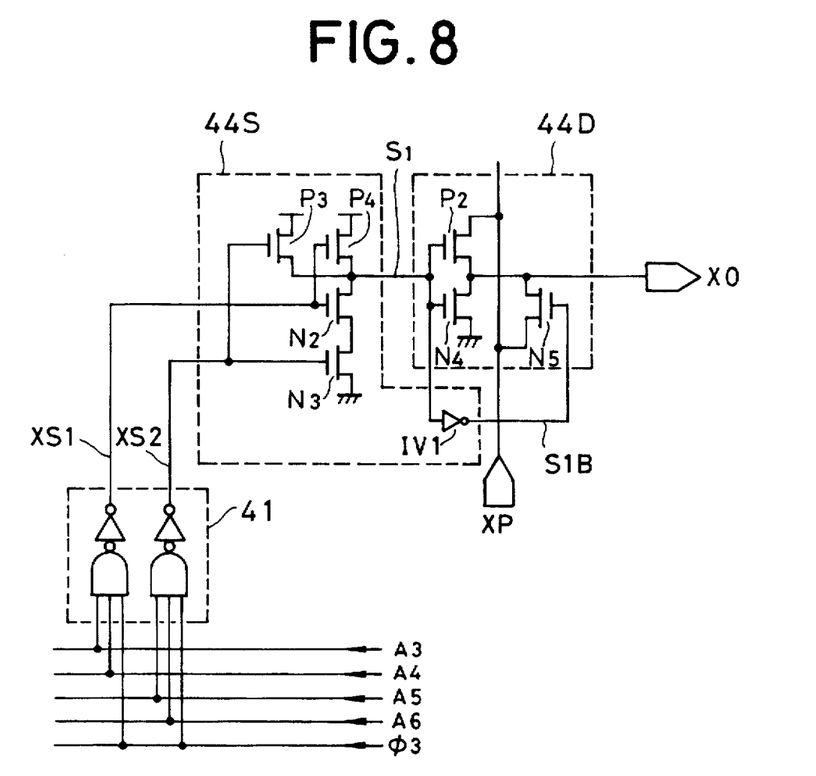
FIG. 8 is a circuit diagram showing a further embodiment of the row decoder in FIG. 1.

FIG. 8 is a circuit diagram showing a further embodiment of the word decoder in the preferred embodiment of the semiconductor memory device according to the invention. With reference to FIG. 8, the shown embodiment of the row decoder is differentiated from that in the immediately former embodiment in that the 3-input NAND circuit in the selecting portion 44S is replaced with 2-input NAND circuit only inputting the block selection pre-decoded signals XS1 and XS2. The control signal φ3 is additionally input to the block selection pre-decoded circuit 41 outputting the block selection pre-decoded signals XS1 and XS2 by decoding the address signal for controlling the word selection control signal S1.

Other operations of the circuit are similar to those of FIG. 7, and the potential level of the word selection pre-decoded signal XP is supplied to the word line signal X0 in synchronism with the control signal φ3.

As set forth above, the semiconductor memory device according to the present invention can avoid power source voltage dependency of the selected word line signal by controlling the row decoder with the control signal synchronized with the detection signal of address transition, placing all of the word line signals as output of the row decoder in non-active state before initiation of the next reading operation in response to transition of the next address signal, avoiding switching between the selected word line signal and the non-selected word line signal during the reading out period to fix the selection level of the selected word line signal and to allow variation of only non-selected word line signals. Therefore, selection speed of the memory cell is determined depending only upon the speed of the non-selected word line speed.

The non-selected word line signal becomes higher in speed at higher voltage. Therefore, higher speed access of the external output is provided. In addition, it is advantageous for expansion of the operational margin.

On the other hand, since the latch circuit inputs and holds the sense amplifier output and inputs the same, compatibility to the existing semiconductor memory device can be provided in the output timing of the output signal. Also, since no new signal input terminal is required, the semiconductor memory device according to the present invention can be mounted in the same manner as the existing semiconductor memory device.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as being limited to the specific embodiment set out above, but also to include all possible embodiments described by the appended claims equivalent thereof.

What is claimed is:

1. A semiconductor memory device comprising:

a memory array comprising a plurality of memory cells arranged in an array;

an address transition detection circuit for generating a transition detection signal in response to a transition of either one of a row address signal and a column address signal;

a delay circuit for delaying a trailing edge of said transition detection signal to generate first to third control signals $\Phi1$, $\Phi2$, and $\Phi3$, having corresponding pulses with respective expanded pulse widths P such that $P\Phi < P\Phi < P\Phi3$;

a row decoder for activating a word line in response to a row address signal during said corresponding pulse of said third control signal $\Phi3$;

a sense amplifier for sensing memory data stored in a memory cell of said memory array during said corresponding pulse of said second control signal $\Phi2$;

a latch circuit for inputting and holding the output of said sense amplifier during said corresponding pulse of said first control signal $\Phi1$; and an output circuit for outputting data from said latch circuit to an output terminal subsequent to said corresponding pulse of said second control signal $\Phi2$.

2. A semiconductor memory device as set forth in claim 1, wherein said memory array is comprised of a plurality of blocks, and wherein said row decoder comprises:

a block selection pre-decoder circuit for decoding a part of an address signal group of a row address signal and generating a block selection pre-decoded signal corresponding to one of said blocks;

a word selection pre-decoder circuit for decoding a remaining part of said address signal group of said row address signal and generating a word selection pre-decoded signal corresponding to a word of said memory cell; and a plurality of decoding block circuits, each corresponding to a respective one of said blocks, for selecting a word line of said memory array in accordance with said block selection pre-decoded signal and said word selection pre-decoded signal and for activating a selected word line during said corresponding period of said third control signal $\Phi3$.

3. A semiconductor memory device as set forth in claim 2, wherein each of said decoding block circuits comprises:

AND means for generating, from a logical combination of said block selection pre-decoded signal and said third control signal $\Phi3$, a word selection control signal and its inverted signal; and a plurality of decoding means for activating a word line of said memory array according to said word selection control signal.

4. A semiconductor memory device as set forth in claim 3, wherein said AND means comprises:

a transistor of a first-conductive type provided between an output line of said word selection control circuit and a first reference potential point and inputting said third control signal $\Phi3$ on the gate thereof; and a first transistor of a second-conductive type and a plurality of transistors of said second-conductive type provided in series between the output line of said word selection control circuit and a second reference potential, the gate of said first transistor of said second type being coupled to receive said third control signal $\Phi3$ and respective gates of said plurality of transistors being coupled to receive said block selection pre-decoded signal.

5. A semiconductor memory device as set forth in claim 4, further comprising an inverter for inverting said word selection control signal.

6. A semiconductor memory device as set forth in claim 4, wherein said decoding means comprises:

a transistor of the first-conductive type provided between the output line of said word selection pre-decoder circuit and a word line of said memory array to receive said word selection control signal on the gate thereof; and a transistor of the second-conductive type provided between an output line of said word selection pre-decoder circuit and said word line of said memory array to receive said inverted signal on the gate thereof; and a transistor of the second-conductive type provided between said word line and a second reference potential point to receive said word selection control signal on the gate thereof.

7. A semiconductor memory device as set forth in claim 3, wherein said AND means comprises;

a transistor of a first-conductive type provided between an output line of said word selection control circuit and a first reference potential point and coupled to receive said third control signal $\Phi3$ on the gate thereof;

a transistor of the first-conductive type provided between an output line of said word selection control circuit and a first reference potential point and coupled to receive said block selection control signal on the gate thereof; and a first transistor of a second-conductive type and a plurality of transistors of the second-conductive type provided in series between the output line of said word selection control circuit and a second reference potential, said first transistor being coupled to receive said third control signal $\Phi3$ and said plurality of transistors being coupled to receive said block selection pre-decoded signal.

8. A semiconductor memory device as set forth in claim 7, further comprising an inverter for inverting said word selection control signal.

9. A semiconductor memory device as set forth in claim 1, wherein said memory array comprises a plurality of blocks, and wherein said row decoder comprises:

a block selection pre-decoder circuit for decoding a part of an address signal group and generating a block selection pre-decoded signal for selecting one of said block; and a word selection pre-decoder circuit for decoding a remaining part of said address signal group and generating a word selection pre-decoded signal for selecting a word of said memory cell;

a plurality of decoding block circuits each corresponding to a respective one of said blocks for selecting one of the word lines of said memory array in accordance with said block selection pre-decoded signal and said word selection pre-decoded signal, and for activating a selected word line during said corresponding period of said third control signal $\Phi3$.

10. A semiconductor memory device as set forth in claim 9, wherein each of said decoding block circuits comprises:

AND means for receiving said block selection pre-decoded signal and generating a word selection control signal and its inverted signal; and a plurality of decoding means for activating a word line of said memory array according to said word selection pre-decoded signal and activating the selected word line.

11. A semiconductor memory device as set forth in claim 10, wherein said AND means comprises:

a plurality of transistors of a first-conductive type provided between a first reference potential point and an output line of said word selection control signal in parallel to receive said block selection pre-decoded signal on respective gates thereof; and a plurality transistors of a second-conductive type provided in series between a second reference potential point and said output line of said word selection control signal to receive said block selection predecoded signal on respective gates thereof.

12. A semiconductor memory device as set forth in claim 11, further comprising an inverter for inverting said word selection control signal.

* * * * *